(12) United States Patent
Shiokawa

(10) Patent No.: US 11,391,794 B2
(45) Date of Patent: Jul. 19, 2022

(54) SPIN-ORBIT-TORQUE MAGNETIZATION ROTATIONAL ELEMENT, SPIN-ORBIT-TORQUE TYPE MAGNETORESISTANCE EFFECT ELEMENT, AND MAGNETIC MEMORY

(71) Applicant: TDK CORPORATION, Tokyo (JP)

(72) Inventor: Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 232 days.

(21) Appl. No.: 16/756,388

(22) PCT Filed: May 10, 2019

(86) PCT No.: PCT/JP2019/018731
§ 371 (c)(1),
(2) Date: Apr. 15, 2020

(87) PCT Pub. No.: WO2019/230341
PCT Pub. Date: Dec. 5, 2019

(65) Prior Publication Data
US 2020/0278403 A1    Sep. 3, 2020

(30) Foreign Application Priority Data
May 31, 2018   (JP) .............................. JP2018-105393

(51) Int. Cl.
*G11C 11/16* (2006.01)
*G01R 33/09* (2006.01)
(Continued)

(52) U.S. Cl.
CPC .......... *G01R 33/093* (2013.01); *G11C 11/161* (2013.01); *H01L 27/228* (2013.01);
(Continued)

(58) Field of Classification Search
CPC ....... H01L 27/228; H01L 43/04; H01L 43/08; H01L 43/10; G11C 11/161; G01R 33/093
(Continued)

(56) References Cited

U.S. PATENT DOCUMENTS 9,025,371 B1    5/2015 Huai et al.
10,447,277 B1 * 10/2019 Kazemi .................. H03K 19/20
(Continued)

FOREIGN PATENT DOCUMENTS

JP    2011-258596 A    12/2011
JP    2017-059679 A     3/2017
(Continued)

OTHER PUBLICATIONS

Oogane et al.; "Magnetic Damping in Ferromagnetic Thin Films;" Japanese Journal of Applied Physics; 2006; pp. 3889-3891; vol. 45, No. 5A.
(Continued)

*Primary Examiner* — Jami Valentine Miller
(74) *Attorney, Agent, or Firm* — Oliff PLC

(57) ABSTRACT

A spin-orbit-torque magnetization rotational element includes: a spin-orbit-torque wiring; and a laminated body laminated on the spin-orbit-torque wiring, wherein the laminated body includes a first ferromagnetic layer, an oxide containing layer, and a second ferromagnetic layer in order from the spin-orbit-torque wiring, wherein the oxide containing layer contains an oxide of a non-magnetic element, and wherein the first ferromagnetic layer and the second ferromagnetic layer are ferromagnetically coupled to each other.

16 Claims, 6 Drawing Sheets

(51) Int. Cl.
*H01L 27/22* (2006.01)
*H01L 43/04* (2006.01)
*H01L 43/08* (2006.01)
*H01L 43/10* (2006.01)

(52) U.S. Cl.
CPC .............. *H01L 43/04* (2013.01); *H01L 43/08* (2013.01); *H01L 43/10* (2013.01)

(58) Field of Classification Search
USPC ........................................................ 257/421
See application file for complete search history.

(56) References Cited

U.S. PATENT DOCUMENTS

| | | | |
|---|---|---|---|
| 11,211,552 B2* | 12/2021 | Shiokawa | H01L 43/04 |
| 2013/0094284 A1 | 4/2013 | Ohno et al. | |
| 2017/0077177 A1 | 3/2017 | Shimomura et al. | |
| 2017/0229160 A1* | 8/2017 | Ma | H01L 43/06 |
| 2017/0279038 A1* | 9/2017 | Wu | H01L 43/08 |
| 2018/0040807 A1* | 2/2018 | Saito | H01L 27/228 |
| 2018/0254773 A1* | 9/2018 | Yoshinari | H01L 43/08 |
| 2019/0304526 A1 | 10/2019 | Honjo et al. | |
| 2020/0279597 A1* | 9/2020 | Wang | G11C 11/18 |
| 2021/0083175 A1* | 3/2021 | Suda | H01L 29/82 |
| 2022/0029089 A1* | 1/2022 | Sasaki | H01L 43/04 |

FOREIGN PATENT DOCUMENTS

| | | |
|---|---|---|
| JP | 2018-022796 A | 2/2018 |
| WO | 2017/212895 A1 | 12/2017 |

OTHER PUBLICATIONS

Miron et al.; Perpendicular switching of a single ferromagnetic layer induced by in-plane current injection; Nature; 2011; pp. 189-194; vol. 476.

An et al.; "Current-induced magnetization switching using an electrically insulating spin-torque generator;" Science Advances; 2018; pp. 1-8; vol. 4.

Jul. 23, 2019 Search Report issued in International Patent Application No. PCT/JP2019/018731.

* cited by examiner

SPIN-ORBIT-TORQUE MAGNETIZATION ROTATIONAL ELEMENT, SPIN-ORBIT-TORQUE TYPE MAGNETORESISTANCE EFFECT ELEMENT, AND MAGNETIC MEMORY

TECHNICAL FIELD

The present invention relates to a spin-orbit-torque magnetization rotational element, a spin-orbit-torque type magnetoresistance effect element, and a magnetic memory. Priority is claimed on Japanese Patent Application No. 2018-105393, filed May 31, 2018, the content of which is incorporated herein by reference.

BACKGROUND ART

A giant magnetoresistance (GMR) element including a multilayer film of a ferromagnetic layer and a non-magnetic layer and a tunnel magnetoresistance (TMR) element using an insulating layer (tunnel barrier layer, barrier layer) for a non-magnetic layer are known. These elements are used in magnetic sensors, high-frequency components, magnetic heads, nonvolatile random access memories (MRAM), and the like.

The MRAM reads and writes data using a characteristic that the element resistance of the TMR element changes when the magnetization directions of two ferromagnetic layers sandwiching the insulating layer change. As a writing method of the MRAM, a writing (magnetization reversal) method using a magnetic field generated by a current or a writing (magnetization reversal) method using a spin transfer torque (STT) generated by flowing a current in a lamination direction of a magnetoresistance effect element is known.

In the magnetoresistance effect element performing writing using an STT, there has been an attempt to decrease the damping constant of the ferromagnetic layer for performing the magnetization reversal. For example, Patent Document 1 describes a method of setting the damping constant to be 0.01 or less. It is known that the critical writing current density using an STT is proportional to the damping constant of the ferromagnetic layer and it is preferable to use a material having a low damping constant from the viewpoint of energy saving, high durability, and high integration. In recent years, it has come to be expected that Mn—Ga and Mn—Ge alloys will be able to the materials having low damping constants. However, when the damping constant of the ferromagnetic layer is low, there is a possibility that erroneous writing may be performed by the reading current. As a result, the problem of lowering the reliability of a device also occurs.

The damping constant is a physical quantity generated from spin-orbit interaction. For that reason, the damping constant has a close relationship with the magnetic anisotropic energy. In general, when the damping constant is small, the magnetic anisotropic energy is also small. When the magnetic anisotropic energy decreases, the magnetization of the ferromagnetic layer is more easily reversed and hence data can be more easily read and written.

Further, Non-Patent Document 1 described that a Co—Fe alloy which is a material generally used in a magnetoresistance effect element has a damping constant of less than 0.01. According to Non-Patent Document 1, a Co—Fe—B alloy manufactured by sputtering also has a damping constant of less than 0.01. Among the Co—Fe—B alloys, those having a damping constant of 0.01 or more are only structures other than a BCC structure which cannot obtain high output characteristics. For that reason, a ferromagnetic material having a damping constant of less than 0.01 is used in the magnetoresistance effect element using an STT.

Meanwhile, in recent years, magnetization reversal using a pure spin current generated by spin-orbit interaction has been gaining attention as means for reducing a reversal current (for example, Non-Patent Document 2). The pure spin current generated by the spin-orbit interaction causes a spin-orbit-torque (SOT). The pure spin current is generated by the same number of upward spin electrons and downward spin electrons flowing in opposite directions. In the pure spin current, since the number of electrons flowing in the opposite direction is the same, the charge flow is canceled. For that reason, the current flowing to the magnetoresistance effect element due to the flow of the pure spin current is zero and the long life of the magnetoresistance effect element is expected.

Also in the magnetization reversal using an SOT, the damping constant is one of the factors affecting the behavior of the magnetization reversal. Non-Patent Document 3 describes that a damping constant of $Ni_{81}Fe_{19}$ increases as the degree of oxidation of a Pt oxide film increases in a laminated body of a Pt oxide film, $Ni_{81}Fe_{19}$, and an oxide cap layer.

CITATION LIST

Patent Literature

[Patent Document 1] Japanese Unexamined Patent Application, First Publication No. 2011-258596

Non-Patent Literature

[Non-Patent Document 1] M. Oogane, T. Wakitani, S. Yakata, R. Yilgin, Y. Ando, A. Sakuma and T. Miyazaki, Japanese Journal of Applied Physics, Vol. 45, pp. 3889-3891 (2006).

[Non-Patent Document 2] I. M. Miron, K. Garello, G. Gaudin, P. J. Zermatten, M. V. Costache, S. Auffret, S. Bandiera, B. Rodmacq, A. Schuhl, and P. Gambardella, Nature, 476,189(2011).

[Non-Patent Document 3] Hongyu An, Takeo Ohno, Yusuke Kanno, Yuito Kageyama, Yasuaki Monnai, Hideyuki Maki, Ji Shi, Kazuya Ando, Science Advances, 4, eaar 2250 (2018)

SUMMARY OF INVENTION

Technical Problem

Research on the spin-orbit-torque magnetization rotational element using an SOT has just begun. The magnetization reversal element using an SOT is different from the magnetization reversal element using an STT in the mechanism of magnetization reversal. For that reason, an appropriate configuration for driving the magnetization reversal element using an SOT is not sufficiently known.

The present invention has been made in view of the above-described problems and an object of the present invention is to provide a spin-orbit-torque magnetization rotational element, a spin-orbit-torque type magnetoresistance effect element, and a magnetic memory capable of quickly performing magnetization reversal.

Solution to Problem

The present inventors have carried out an examination in order to solve the above-described problems and found that the magnetization reversal of the ferromagnetic layer (free layer) can be performed quickly by inserting an oxide containing layer into the ferromagnetic layer (free layer) performing the magnetization reversal in a spin-orbit-torque magnetization rotational element.

That is, the present invention provides the following means in order to solve the above-described problems.

(1) A spin-orbit-torque magnetization rotational element of a first aspect includes: a spin-orbit-torque wiring; and a laminated body laminated on the spin-orbit-torque wiring, wherein the laminated body includes a first ferromagnetic layer, an oxide containing layer, and a second ferromagnetic layer in order from the spin-orbit-torque wiring, wherein the oxide containing layer contains an oxide of a non-magnetic element, and wherein the first ferromagnetic layer and the second ferromagnetic layer are ferromagnetically coupled to each other.

(2) In the spin-orbit-torque magnetization rotational element according to the above-described aspect, an easy axis of magnetization of the first ferromagnetic layer may intersect a direction of a spin injected from the spin-orbit-torque wiring into the first ferromagnetic layer.

(3) In the spin-orbit-torque magnetization rotational element according to the above-described aspect, the non-magnetic element of the oxide contained in the oxide containing layer may contain at least one selected from a group consisting of Al, Si, Mg, Ti, Cr, Cu, Mo, Ru, Rh, Pd, Hf, Ta, W, Re, Ir, Pt, and Bi.

(4) In the spin-orbit-torque magnetization rotational element according to the above-described aspect, a film thickness of the oxide containing layer may be 1.0 nm or less.

(5) In the spin-orbit-torque magnetization rotational element according to the above-described aspect, the oxide contained in the oxide containing layer may contain insufficient oxygen with respect to a stoichiometric composition.

(6) In the spin-orbit-torque magnetization rotational element according to the above-described aspect, a diffusion preventing layer may be inserted between the oxide containing layer and the second ferromagnetic layer.

(7) In the spin-orbit-torque magnetization rotational element according to the above-described aspect, a film thickness of the first ferromagnetic layer may be thicker than a film thickness of the second ferromagnetic layer.

(8) In the spin-orbit-torque magnetization rotational element according to the above-described aspect, the second ferromagnetic layer may contain at least one element selected from a group consisting of Co, Fe, and B.

(9) A spin-orbit-torque type magnetoresistance effect element according to a second aspect includes: the spin-orbit-torque magnetization rotational element according to the above-described aspect; a non-magnetic layer which is laminated on the side opposite to the spin-orbit-torque wiring in the laminated body; and a third ferromagnetic layer, the laminated body and the non-magnetic layer being sandwiched between the third ferromagnetic layer and the spin-orbit-torque wiring.

(10) A magnetic memory according to a third aspect includes a plurality of the spin-orbit-torque type magnetoresistance effect elements according to the above-described aspect.

Advantage of the Invention

According to the present invention, it is possible to provide a spin-orbit-torque magnetization rotational element, a spin-orbit-torque type magnetoresistance effect element, and a magnetic memory capable of quickly performing magnetization reversal.

DESCRIPTION OF EMBODIMENTS

Figure 1:
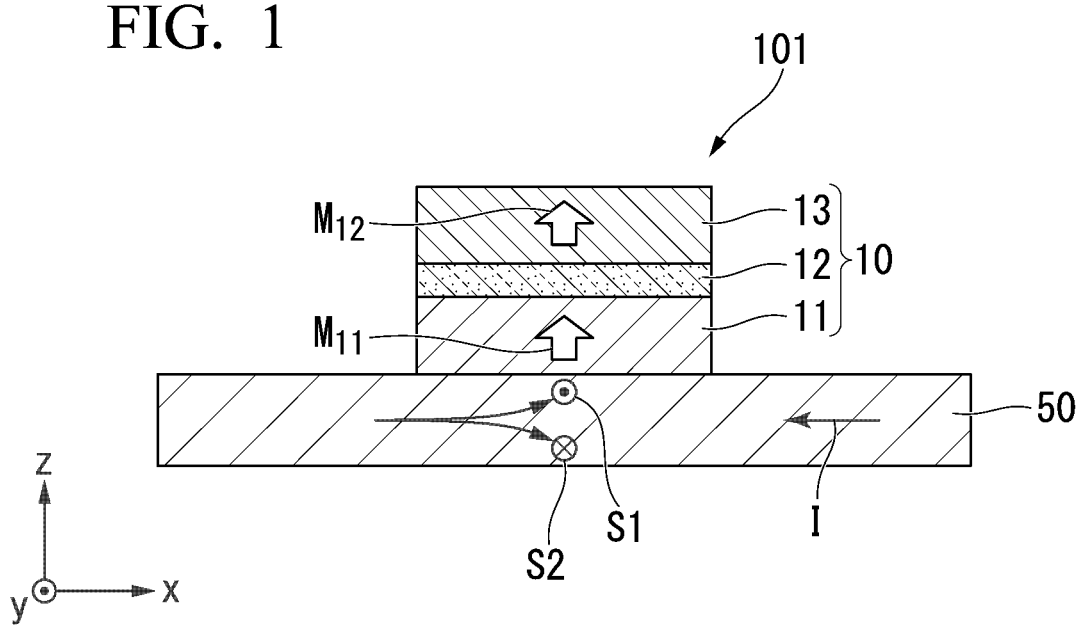
FIG. 1 is a schematic cross-sectional view of an example of a spin-orbit-torque magnetization rotational element according to a first embodiment.

Hereinafter, preferred examples of the present invention will be described in detail by appropriately referring to the drawings. In the drawings used in the following description, characteristic parts are enlarged for convenience of description in order to easily understand the characteristics of the present invention and hence the dimensional ratio of each component may be different from the actual one. The materials, dimensions, and the like exemplified in the following description are merely examples and the present invention is not limited thereto and can be implemented with appropriate modifications within a range in which the effects of the present invention are exhibited.

<First Embodiment (Spin-Orbit-Torque Magnetization Rotational Element)>

FIG. 1 is a cross-sectional view schematically showing an example of a spin-orbit-torque magnetization rotational element according to a first embodiment. FIG. 1 shows a cross-section in which a spin-orbit-torque magnetization rotational element is cut along the xz plane passing through a center of a spin-orbit-torque wiring 50 in the y direction. A spin-orbit-torque magnetization rotational element 101 shown in FIG. 1 includes a laminated body 10 and the spin-orbit-torque wiring 50.

In the present specification, a direction in which a spin-orbit-torque wiring extends is referred to as the x direction, a direction in which the laminated body 10 is laminated is referred to as the z direction, and a direction which is orthogonal to the x direction and the z direction is referred to as the y direction.

[Laminated Body 10]

The laminated body 10 is laminated in the thickness direction of the spin-orbit-torque wiring 50. The laminated body 10 includes a first ferromagnetic layer 11, an oxide containing layer 12, and a second ferromagnetic layer 13 in order from the spin-orbit-torque wiring 50. The first ferromagnetic layer 11 and the second ferromagnetic layer 13 are ferromagnetic ally coupled to each other.

(First Ferromagnetic Layer and Second Ferromagnetic Layer)

A ferromagnetic material, in particular, a soft magnetic material can be applied to the first ferromagnetic layer 11 and the second ferromagnetic layer 13. For example, metals selected from a group consisting of Cr, Mn, Co, Fe, and Ni, alloys containing at least one or more of these metals, and alloys containing these metals and at least one or more elements from B, C and N can be used. Specifically, Co—Fe, Co—Fe—B, and Ni—Fe can be exemplified. When the first ferromagnetic layer 11 is an in-plane magnetic film, for example, a Co—Ho alloy ($CoHo_2$), a Sm—Fe alloy ($SmFe_{12}$), or the like can be used.

A Heusler alloy such as $Co_2FeSi$ may be used for the first ferromagnetic layer 11 and the second ferromagnetic layer 13. The Heusler alloy contains an intermetallic compound with a chemical composition of XYZ or $X_2YZ$. X in the chemical composition of the Heusler alloy is a transition metal element or a noble metal element of the Co, Fe, Ni, or Cu group in the periodic table. Y in the chemical composition of the Heusler alloy is a transition metal from the Mn, V, Cr or Ti group or an element type of X. Z in the chemical composition of the Heusler alloy is a typical element of Group III to Group V. Examples of the Heusler alloys include, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. The second ferromagnetic layer 13 preferably contains at least one element selected from a group consisting of Co, Fe, and B. The second ferromagnetic layer 13 is particularly preferably made of Co—Fe—B.

The first ferromagnetic layer 11 and the second ferromagnetic layer 13 are ferromagnetically coupled to each other. That is, the magnetization $M_{11}$ of the first ferromagnetic layer 11 and the magnetization $M_{13}$ of the second ferromagnetic layer 13 are orientated in the same direction. Whether the magnetization $M_{11}$ and the magnetization $M_{13}$ are ferromagnetically coupled or antiferromagnetically coupled can be controlled by the material and thickness of the oxide containing layer 12. In the embodiment, the material and the film thickness of the oxide containing layer 12 are controlled so that the magnetization $M_{11}$ and the magnetization $M_{13}$ are ferromagnetically coupled to each other.

Further, it is preferable that the film thickness of the first ferromagnetic layer 11 is thicker than the film thickness of the second ferromagnetic layer 13. When the film thickness of the first ferromagnetic layer 11 is thick, the effect of orienting the magnetization $M_{11}$ the in-plane direction works strongly. Meanwhile, when the film thickness of the second ferromagnetic layer 13 is thin, the effect of orienting the magnetization $M_{13}$ in the direction perpendicular to the plane works strongly. Since the magnetization $M_{11}$ and the magnetization $M_{13}$ are ferromagnetically coupled to each other, the magnetization $M_{11}$ of the first ferromagnetic layer 11 is oriented in a direction inclined from the direction perpendicular to the plane. When the magnetization $M_{11}$ of the first ferromagnetic layer 11 is inclined, the reversal symmetry of the magnetization reversal is broken, the magnetization reversal of the first ferromagnetic layer 11 easily occurs, and the magnetization reversal without a magnetic field becomes easy. It is preferable that the film thickness of the first ferromagnetic layer 11 is in a range of 0.3 nm or more and 2.0 nm or less. It is preferable that the film thickness of the second ferromagnetic layer 13 is in a range of 0.5 nm or more and 3.0 nm or less. It is preferable that the film thickness of the first ferromagnetic layer 11 is in a range of 150% or more and 200% or less with respect to the film thickness of the second ferromagnetic layer 13.

(Oxide Containing Layer)

The oxide containing layer 12 is located between the first ferromagnetic layer 11 and the second ferromagnetic layer 13.

As described in Non-Patent Document 3, when an oxide film is disposed adjacent to the ferromagnetic layer, the damping constant of the ferromagnetic layer increases. The damping constant of the first ferromagnetic layer 11 and the second ferromagnetic layer 13 increases as the oxide containing layer 12 is adjacent to each of the first ferromagnetic layer 11 and the second ferromagnetic layer 13. The magnetization of the ferromagnetic material performs magnetization reversal while performing procession. When the damping constant is large, the force of the magnetization $M_{11}$ in the direction of easy magnetization increases and the magnetization reversal can be performed quickly.

The oxide containing layer 12 contains an oxide of a non-magnetic element. It is preferable that the non-magnetic element contains at least one selected from a group consisting of Al, Si, Mg, Ti, Cr, Cu, Mo, Ru, Rh, Pd, Hf, Ta, W, Re, Ir, Pt, and Bi.

When the non-magnetic element is a light metal (Al, Si, Mg, Ti, Cr, Cu) having an atomic number of 38 or less, a thin and stable oxide containing layer 12 can be formed. Since the electronegativity of these light elements is relatively small, diffusion of oxygen by heat is unlikely to occur and the light elements are stable as oxides.

When the non-magnetic element is a heavy metal having an atomic number of 39 or more (Mo, Ru, Rh, Pd, Hf, Ta, W, Re, Ir, Pt, and Bi), the oxide containing layer 12 can reduce a reversal current density for reversing the magnetization $M_{11}$ of the first ferromagnetic layer 11. A part of the current also enters the oxide containing layer 12. This is because SOT (torque) is also efficiently generated in the oxide containing layer 12 when a current flows to the oxide containing layer 12 containing a heavy metal. Then, this contributes to the magnetization reversal of the first ferromagnetic layer 11.

It is preferable that the oxide of the ferromagnetic metal element contained in the oxide containing layer 12 contains insufficient oxygen with respect to the stoichiometric composition. In this case, the spin current supplied from the first ferromagnetic layer 11 easily passes through the oxide containing layer 12 and the efficiency of transmitting the spin current to the second ferromagnetic layer 13 is improved. It is preferable that the oxide of the ferromagnetic metal element contains insufficient oxygen in a range of 5 atomic % to 30 atomic % with respect to the stoichiometric composition.

It is preferable that the film thickness of the oxide containing layer 12 is 1.0 nm or less. In this case, since the first ferromagnetic layer 11 and the second ferromagnetic layer 13 are more strongly ferromagnetically coupled to each other, stability of magnetization against thermal disturbances increases. Further, when the film thickness of the oxide containing layer 12 is thin, oxygen is scattered and the symmetry of the crystal structure of the first ferromagnetic layer 11 is easily broken. For this reason, it is preferable that the film thickness of the oxide containing layer 12 is at least one atomic layer. In the case of one atomic layer, a continuous and uniform layer is not formed and an oxide is scattered. However, in this case, the layer is also treated as an oxide containing layer.

[Spin-Orbit-Torque Wiring]

The spin-orbit-torque wiring 50 extends in the x direction. The spin-orbit-torque wiring 50 is located on one surface of the ferromagnetic conductor layer 11a. The spin-orbit-torque wiring 50 may be directly connected to the ferromagnetic conductor layer 11a or may be connected thereto through other layers.

When a current flows to the spin-orbit-torque wiring 50, a spin current is generated due to a spin Hall effect. The spin Hall effect is a phenomenon in which a spin current is induced in a direction orthogonal to the direction of a current based on a spin-orbit interaction when a current flows through a wiring. A mechanism in which a spin current is generated by the spin Hall effect will be described.

As shown in FIG. 1, a current 1 flows in the x direction when a potential difference is applied to both ends of the spin-orbit-torque wiring 50 in the x direction. When the current I flows, a first spin S1 oriented in the y direction and a second spin S2 oriented in the −y direction are respectively bent in a direction orthogonal to the current. The normal Hall effect and the spin Hall effect are common in that the moving charges (electrons) can bend the movement (moving) direction. Meanwhile, the normal Hall effect and the spin Hall effect are different in the conditions required for the moving charge (electrons) to bend the movement (moving) direction. In the normal Hall effect, charged particles moving in a magnetic field are subject to the Lorentz force to bend the moving direction. However, the spin Hall effect is largely different in that the moving direction is bent only by the movement of electrons (only the flow of current) without the presence of a magnetic field. In order to eliminate the uneven distribution of the first spin S1 and the second spin S2 caused by the spin Hall effect, a spin current is generated in the z direction.

Since the number of electrons of the first spin S1 is equal to the number of electrons of the second spin S2 in the non-magnetic material (a material that is not a ferromagnetic material), the number of electrons of the first spin S1 going upward is equal to the number of electrons of the second spin S2 going downward in the drawing. For that reason, a current as a net flow of charge is zero. This spin current without this current is particularly called a pure spin current.

Here, if the electron flow of the first spin S1 is represented by $J_\uparrow$, the electron flow of the second spin S2 is represented by $J_\downarrow$, and the spin current is represented by $J_s$, this is defined as $J_s=J_\uparrow-J_\downarrow$. A spin current $J_s$ flows in the z direction of the drawing. In FIG. 1, the first ferromagnetic layer 11 is present on the surface of the spin-orbit-torque wiring 50. Therefore, spin is injected into the first ferromagnetic layer 11.

It is preferable that the direction of the spin injected into the first ferromagnetic layer 11 intersects the easy axis of magnetization of the first ferromagnetic layer 11.

For example, when the magnetization $M_{11}$ of the first ferromagnetic layer 11 is oriented in the +y direction and the direction of the injected spin is the −y direction (the direction of the spin injected into the first ferromagnetic layer 11 matches the easy axis of magnetization of the first ferromagnetic layer 11), the magnetization $M_{11}$ receives a force in which a vector direction is different by 180° due to the injected spin. For that reason, the initial operation of the magnetization $M_{11}$ is slow.

In contrast, for example, when the magnetization $M_{11}$ of the first ferromagnetic layer 11 is oriented in the +z direction and the direction of the injected spin is the −y direction (the direction of the spin injected into the first ferromagnetic layer 11 intersects the easy axis of magnetization of the first ferromagnetic layer 11), the magnetization $M_{11}$ quickly starts to rotate by receiving a force in which a vector direction is different due to the injected spin. For that reason, the initial operation of the magnetization $M_{11}$ is fast.

When the damping constant of the first ferromagnetic layer 11 is large, the magnetization reversal of the magnetization $M_{11}$ is fast. When the direction of the injected spin intersects the easy axis of magnetization of the first ferromagnetic layer 11, the magnetization reversal of the magnetization $M_{11}$ can be further accelerated. The intersection relationship between the direction of the spin injected into the first ferromagnetic layer 11 and the easy axis of magnetization of the first ferromagnetic layer 11 is only for the spin-orbit-torque magnetization rotational element using an SOT.

The spin-orbit-torque wiring 50 is made of a metal, an alloy, an intermetallic compound, a metal boride, a metal carbide, a metal silicide, or a metal phosphide having a function of generating a spin current by a spin Hall effect when a current flows.

The main configuration of the spin-orbit-torque wiring 50 is preferably a non-magnetic heavy metal. Here, the heavy metal means a metal having a specific gravity of yttrium or more. It is preferable that the non-magnetic heavy metal is a non-magnetic metal having an atomic number of 39 or more and having a large atomic number, having d electrons or f electrons in the outermost shell. These non-magnetic metals have a large spin-orbit interaction that causes the spin Hall effect.

Electrons generally move in the opposite direction to the current regardless of their spin direction. However, the direction in which electrons of non-magnetic metal having a large atomic number having d electrons or f electrons in the outermost shell move depends on the direction of the electron spin. This is because non-magnetic metal having a large atomic number having d or f electrons in the outermost shell has a large spin-orbit interaction and a strong spin Hall effect. Thus, the spin current $J_s$ is likely to occur in a non-magnetic heavy metal having a large atomic number having d electrons or f electrons in the outermost shell.

Further, the spin-orbit-torque wiring 50 may contain magnetic metal. The magnetic metal refers to ferromagnetic metal or antiferromagnetic metal. When a small amount of magnetic metal is contained in non-magnetic metal, magnetic metal becomes a spin scattering factor. When the spin is scattered, the spin-orbit interaction is enhanced and the efficiency of generating a spin current with respect to the current increases.

Meanwhile, when the added amount of the magnetic metal is too large, the generated spin current is scattered by the added magnetic metal. As a result, the effect of reducing the spin current may be increased. For that reason, it is preferable that the molar ratio of the magnetic metal to be added is sufficiently smaller than the total molar ratio of the elements constituting the spin-orbit-torque wiring. It is preferable that the molar ratio of the magnetic metal to be added is 3% or less of the whole.

The spin-orbit-torque wiring 50 may contain a topological insulator. The topological insulator is a substance in which the inside of a substance is an insulator or a high-resistance substance, but a spin-polarized metal state occurs on its surface. An internal magnetic field is generated in the topological insulator due to the spin-orbit interaction. Therefore, a new topological phase appears due to the effect of the spin-orbit interaction even without an external magnetic field. That is, the topological insulator disturbs the symmetry of the magnetization direction of the insulator inside the material or the high-resistance body even without an external magnetic field. The topological insulator can generate a pure spin current with high efficiency due to the strong spin-orbit interaction and the breakage of the reversal symmetry at edges.

Preferred examples of the topological insulator include SnTe, $Bi_{1.5}Sb_{0.5}Te_{1.7}Se_{1.3}$, $TlBiSe_2$, $Bi_2Te_3$, $Bi_{1-x}Sb_x$, and $(Bi_{1-x}Sb_x)_2Te_3$. These topological insulators can generate a spin current with high efficiency.

For example, the spin-orbit-torque magnetization rotational element 101 can be manufactured by laminating the first ferromagnetic layer 11, the oxide containing layer 12, and the second ferromagnetic layer 13 in this order from the spin-orbit-torque wiring 50. Hereinafter, in the present specification, the layers laminated on the spin-orbit-torque wiring 50 may be collectively referred to as a laminated body. For example, in the spin-orbit-torque magnetization rotational element 101, the first ferromagnetic layer 11, the oxide containing layer 12, and the second ferromagnetic layer 13 are collectively referred to as the laminated body 10. As a method of laminating the first ferromagnetic layer 11 and the second ferromagnetic layer 13, known methods such as a sputtering method and a chemical vapor deposition (CVD) method can be used. As a method of laminating the oxide containing layer 12, for example, a method of forming a ferromagnetic metal film by a sputtering method or a CVD method and then oxidizing the obtained ferromagnetic metal film or a method of co-sputtering a ferromagnetic metal and an oxide can be used.

It is preferable that the obtained laminated body 10 is subjected to an annealing treatment. When the annealing treatment is performed, the crystallinity of each layer is improved and the MR ratio of the laminated body 4 can be increased.

As the annealing treatment, it is preferable that the laminated body is heated at a temperature of 300° C. or more and 500° C. or less for 5 minutes or more and 100 minutes or less in the presence of an inert atmosphere such as Ar and then is heated at a temperature of 100° C. or more and 500° C. or less for 1 hour or more and 10 hours or less while a magnetic field of 2 kOe or more and 10 kOe or less is applied thereto.

The spin-orbit-torque magnetization rotational element 101 with the above-described configuration according to the embodiment can quickly perform the magnetization reversal of the second ferromagnetic layer 13. This is because the damping constant of the first ferromagnetic layer 11 and the second ferromagnetic layer 13 increases due to the oxide containing layer provided in the laminated body 10. Since the force of the magnetization $M_{11}$ of the first ferromagnetic layer 11 and the magnetization $M_{13}$ of the second ferromagnetic layer 13 in the easy magnetization direction increases as the damping constant increases, the magnetization reversal can be quickly performed.

Figure 2:
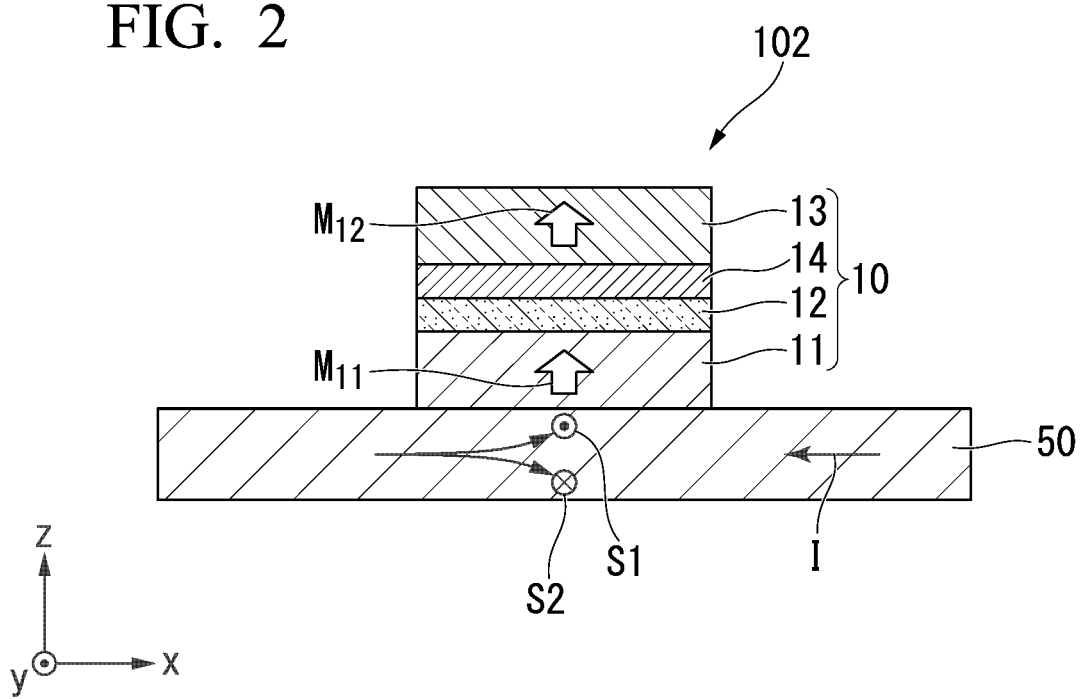
FIG. 2 is a schematic cross-sectional view of another example of a spin-orbit-torque magnetization rotational element according to Modified Example 1.

FIG. 2 is a schematic cross-sectional view of Modified Example 1 of the spin-orbit-torque magnetization rotational element according to the first embodiment. FIG. 2 shows a cross-section in which a spin-orbit-torque magnetization rotational element 102 is cut along the xz plane passing through the center of the spin-orbit-torque wiring 50 in the y direction. The spin-orbit-torque magnetization rotational element 102 shown in FIG. 2 is the same as the spin-orbit-torque magnetization rotational element 101 shown in FIG. 1 except that a diffusion preventing layer 14 is provided. For this reason, the same reference numerals will be given to the same components as those of the spin-orbit-torque magnetization rotational element 101 and a description thereof will be omitted.

The diffusion preventing layer 14 is inserted between the oxide containing layer 12 and the second ferromagnetic layer 13. For example, the diffusion preventing layer is located between the oxide containing layer 12 and the second ferromagnetic layer 13. For example, in a high-temperature environment such as when an annealing treatment is performed during the manufacturing of the spin-orbit-torque magnetization rotational element 102, the diffusion preventing layer 14 prevents the element contained in the second ferromagnetic layer 13 from diffusing into the oxide containing layer 12.

It is preferable that the diffusion preventing layer 14 contains a non-magnetic element. The non-magnetic element is, for example, Mo, Ru, Rh, Pd, Ag, Hf, Ta, W, Re, Ti, Pt, or Au. The diffusion preventing layer 14 may contain one of these elements alone or may contain two or more of these elements in combination. Further, it is preferable that the thickness of the diffusion preventing layer 14 is twice or more the diameter of the element constituting the diffusion preventing layer 14. When the non-magnetic element is formed with such a thickness, the non-magnetic element is strictly scattered like islands. Thus, the diffusion preventing layer 14 is a mixed layer of a part of the upper layer or the lower layer and a non-magnetic element.

It is preferable that the film thickness of the diffusion preventing layer 14 is in a range of 0.3 nm or more and 2.0 nm or less.

The spin-orbit-torque magnetization rotational element 102 can be manufactured similarly to the case of the spin-orbit-torque magnetization rotational element 101 except that the diffusion preventing layer 14 is laminated between the oxide containing layer 12 and the second ferromagnetic layer 13. As a method of laminating the diffusion preventing layer 14, known methods such as a sputtering method and a chemical vapor deposition (CVD) method can be used.

Since the spin-orbit-torque magnetization rotational element 102 with the above-described configuration includes the oxide containing layer 12, the damping constant of the first ferromagnetic layer 11 and the second ferromagnetic layer 13 increases and the magnetization reversal is fast. Further, since the spin-orbit-torque magnetization rotational element 102 includes the diffusion preventing layer 14, elements contained in the second ferromagnetic layer 13 hardly diffuses into the oxide containing layer 12 even in a high-temperature environment. For this reason, the oxide containing layer 12 is stable for a long period of time.

<Second Embodiment (Spin-Orbit-Torque Type Magnetoresistance Effect Element)>

Figure 3:
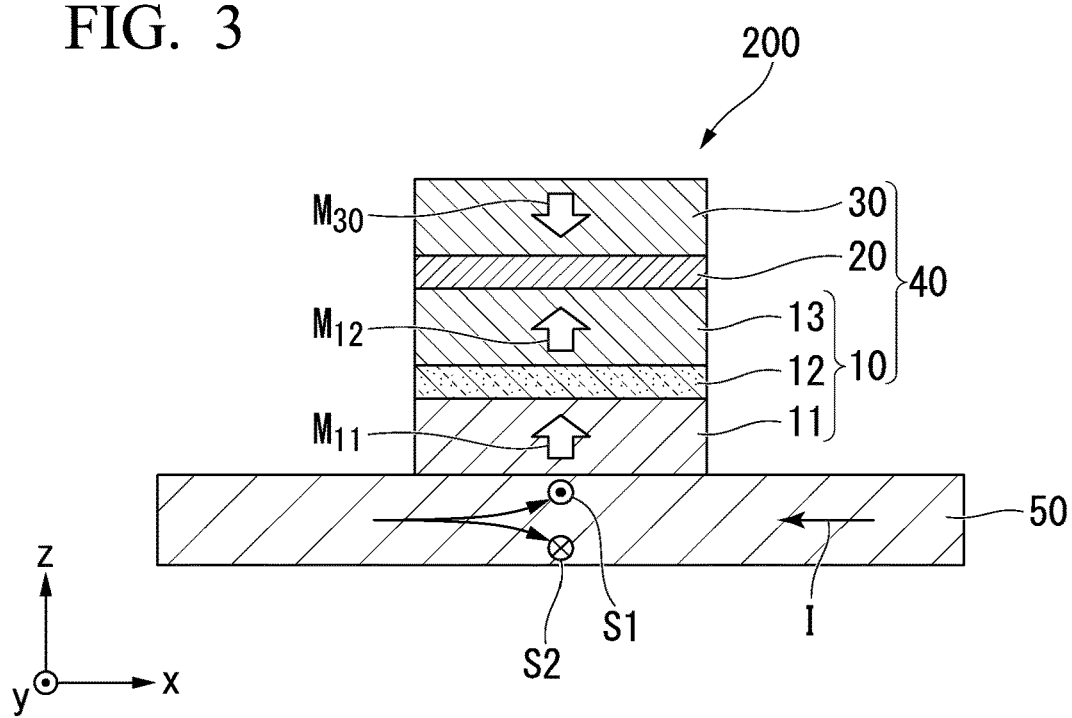
FIG. 3 is a schematic cross-sectional view of an example of a spin-orbit-torque type magnetoresistance effect element according to a second embodiment.

FIG. 3 is a schematic cross-sectional view of a preferred example of a spin-orbit-torque type magnetoresistance effect element according to a second embodiment. FIG. 3 shows a cross-section in which a spin-orbit-torque type magnetoresistance effect element 200 is cut along the xz plane passing through the center of the spin-orbit-torque wiring 50 of in the y direction. The spin-orbit-torque type magnetoresistance effect element 200 shown in FIG. 3 includes the spin-orbit-torque magnetization rotational element 101 according to the first embodiment, a non-magnetic layer 20, and a third ferromagnetic layer 30. The same reference numerals will be given to the same components as those of the spin-orbit-torque magnetization rotational element 101 of the first embodiment and a description thereof will be omitted.

A functional unit 40 formed by laminating the laminated body 10, the non-magnetic layer 20, and the third ferromagnetic layer 30 functions similarly to the normal magnetoresistance effect element. The functional unit 40 functions by fixing the magnetization $M_{30}$ of the third ferromagnetic layer 30 in one direction (the z direction) and relatively changing the direction of the magnetization $M_{13}$ of the second ferromagnetic layer 13. The magnetization $M_{30}$ of the third ferromagnetic layer 30 is harder to move than the magnetization $M_{13}$ of the second ferromagnetic layer 13 when the same external force is applied. In the case of the application to a coercive force difference type (pseudo spin valve type) MRAM, the coercive force of the third ferromagnetic layer 30 is made larger than the coercive force of the second ferromagnetic layer 13. In the case of the application to an exchange bias type (spin valve type) MRAM, the magnetization $M_{30}$ of the third ferromagnetic layer 30 is fixed by the exchange coupling with the antiferromagnetic layer.

Further, in the functional unit 40, when the non-magnetic layer 20 is made of an insulator, the functional unit 40 has the same configuration as a tunneling magnetoresistance (TMR) element. Further, when the non-magnetic layer 20 is made of metal, the functional unit 40 has the same configuration as a giant magnetoresistance (GMR) element.

As a laminated structure of the functional unit 40, a laminated structure of a known magnetoresistance effect element can be adopted. For example, each layer of the functional unit 40 may include a plurality of layers. For example, the functional unit 40 may further include a layer other than the laminated body 10, the non-magnetic layer 20, and the third ferromagnetic layer 30, such as an antiferromagnetic layer for fixing the magnetization direction of the third ferromagnetic layer 30. The third ferromagnetic layer 30 may be called a fixed layer or a reference layer and the laminated body 10 may be called a free layer or a storage layer.

The third ferromagnetic layer 30 is a known material. For example, the third ferromagnetic layer is a metal selected from a group consisting of Cr, Mn, Co, Fe, and Ni and an alloy containing at least one metal selected from this group and exhibiting ferromagnetism. For the third metal layer 30, an alloy containing these metals and at least one or more elements of B, C, and N can also be used in addition to these metals and alloys. For example, Co—Fe or Co—Fe—B can be used for the third ferromagnetic layer 30.

Further, a Heusler alloy such as $Co_2FeSi$ may be used for the third ferromagnetic layer 30. By using the Heusler alloy, the MR ratio of the functional unit 40 can be made higher. The Heusler alloy contains an intermetallic compound having a chemical composition of XYZ or $X_2YZ$ and X in the chemical composition of the Heusler alloy is a transition metal element or a noble metal element of the Co, Fe, Ni, or Cu group in the periodic table. Y in the chemical composition of the Heusler alloy is a transition metal from the Mn, V, Cr or Ti group or an element type of X. Z in the chemical composition of the Heusler alloy is a typical element of Group III to Group V. As the Heusler alloy, for example, $Co_2FeSi$, $Co_2MnSi$, $Co_2Mn_{1-a}Fe_aAl_bSi_{1-b}$, or the like can be used as the third ferromagnetic layer 30.

It is preferable that the film thickness of the third ferromagnetic layer 30 is in a range of 0.5 nm or more and 5.0 nm or less.

In order to further increase the coercive force of the third ferromagnetic layer 30 with respect to the laminated body 10, an antiferromagnetic material such as IrMn or PtMn may be provided in contact with the third ferromagnetic layer 30. In order to prevent the leakage magnetic field of the third ferromagnetic layer 30 from affecting the laminated body 10, a synthetic ferromagnetic coupling structure may be used.

Known materials can be used for the non-magnetic layer 20.

For example, when the non-magnetic layer 20 is made of an insulator (in the case of a tunnel barrier layer), the non-magnetic layer 20 is, for example, $Al_2O_3$, $SiO_2$, MgO, $MgAl_2O_4$, or the like. In addition, as the non-magnetic layer 20, a material in which a part of Al, Si, and Mg is replaced by Zn, Be, or the like can be also used. Among them, when MgO or $MgAl_2O_4$ is used as the non-magnetic layer 20, a coherent tunnel can be realized, so that spin can be injected efficiently. When the non-magnetic layer 20 is made of metal, the non-magnetic layer 20 is, for example, Cu, Au, Ag, or the like. Further, when the non-magnetic layer 20 is made of a semiconductor, the non-magnetic layer 20 is, for example, Si, Ge, $CuInSe_2$, $CuGaSe_2$, Cu (In, Ga) $Se_2$, or the like.

It is preferable that the film thickness of the non-magnetic layer 20 is in a range of 0.3 nm or more and 3.0 nm or less.

The functional unit 40 may further include other layers. For example, an underlayer may be provided between the laminated body 10 and the spin-orbit-torque wiring 50 or a cap layer may be provided on the surface opposite to the non-magnetic layer 20 in the third ferromagnetic layer 30.

When a layer is disposed between the spin-orbit-torque wiring 50 and the first ferromagnetic layer 11, it is preferable not to dissipate the spin propagating from the spin-orbit torque wiring 50. For example, silver, copper, magnesium, aluminum, and the like are known to have a long spin diffusion length of 100 nm or more and are unlikely to dissipate spin. Accordingly, they can be suitably used. Further, it is preferable that the thickness of the layer disposed between the spin-orbit-torque wiring 50 and the first ferromagnetic layer 11 is the spin diffusion length or less of the material constituting this layer. When the thickness of the layer is the spin diffusion length or less, the spin propagated from the spin-orbit-torque wiring 50 can be sufficiently transmitted to the first ferromagnetic layer 11.

The spin-orbit-torque type magnetoresistance effect element 200 reads or records data using a change in the resistance value of the functional unit caused by a difference in relative angle between the magnetization $M_{13}$ of the second ferromagnetic layer 13 and the magnetization $M_{30}$ of the third ferromagnetic layer 30.

The spin-orbit-torque type magnetoresistance effect element 200 can be manufactured by laminating the non-magnetic layer 20 and the third ferromagnetic layer 30 in this order on the second ferromagnetic layer 13 of the spin-orbit-torque magnetization rotational element 101. As a method of laminating the non-magnetic layer 20 and the third ferromagnetic layer 30, known methods such as a sputtering method and a chemical vapor deposition (CVD) method can be used.

It is preferable that the obtained functional unit 40 is subjected to an annealing treatment. When the annealing treatment is performed, the crystallinity of each layer is improved and the MR ratio of the functional unit 40 can be increased.

Since the spin-orbit-torque type magnetoresistance effect element 200 with the above-described configuration includes the oxide containing layer 12, the damping constant of the first ferromagnetic layer 11 and the second ferromagnetic layer 13 increases and the magnetization reversal is fast.

Figure 4:
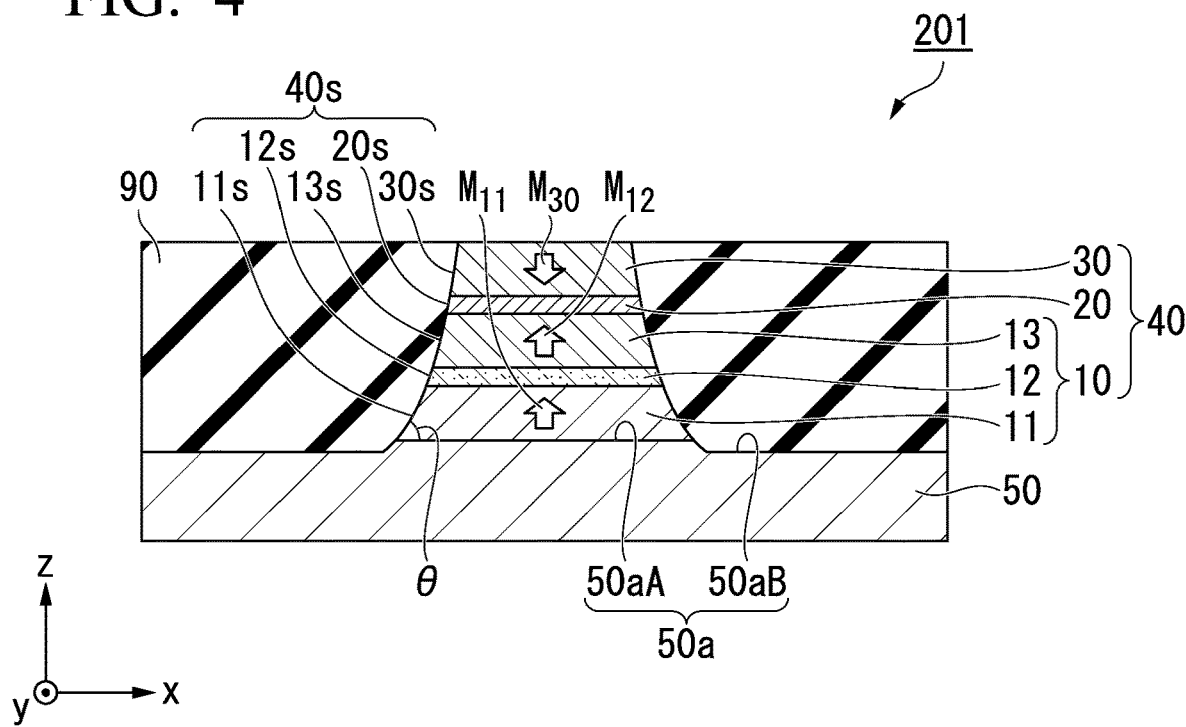
FIG. 4 is a schematic cross-sectional view of the spin-orbit-torque type magnetoresistance effect element according to Modified Example 1.
Figure 5:
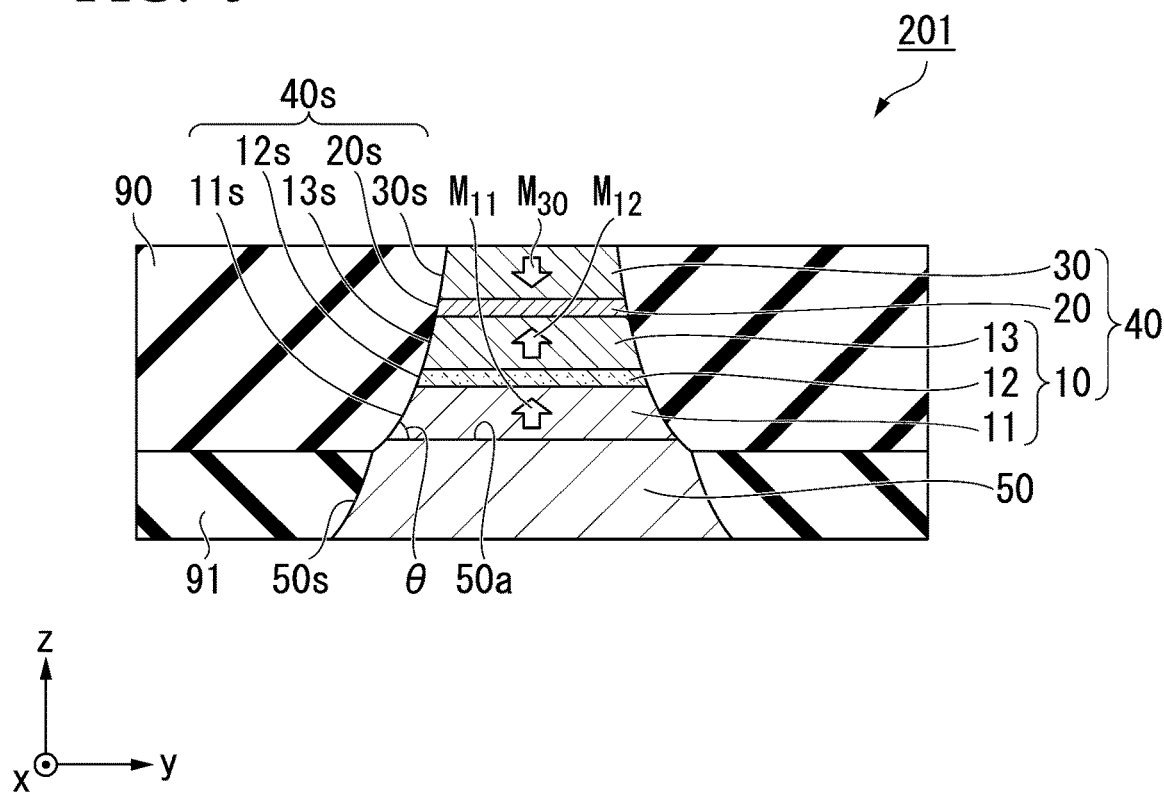
FIG. 5 is a schematic cross-sectional view showing the spin-orbit-torque type magnetoresistance effect element according to Modified Example 1 when taken along another plane.

FIGS. 4 and 5 are schematic cross-sectional views of a spin-orbit-torque type magnetoresistance effect element 201 according to Modified Example 1. FIG. 4 shows a cross-section in which the spin-orbit-torque type magnetoresistance effect element 201 is cut along the xz plane passing through the center of the spin-orbit-torque wiring 50 in the y direction. FIG. 5 shows a cross-section in which the spin-orbit-torque type magnetoresistance effect element 201 is cut along the yz plane passing through the center of the functional unit 40 in the x direction. The spin-orbit-torque type magnetoresistance effect element 201 shown in FIGS. 4 and 5 are the same as the spin-orbit-torque type magnetoresistance effect element 200 except that the shape of the side surface of the functional unit 40 and the shape of a first surface 50a of the spin-orbit-torque wiring 50 are different. For this reason, the same reference numerals will be given to the same components as those of the spin-orbit-torque type magnetoresistance effect element 200 and a description thereof will be omitted.

The functional unit 40 shown in FIGS. 4 and 5 spreads within the xy plane as it goes toward the spin-orbit-torque wiring 50 when viewed from the z direction. When viewed from the z direction, the outer peripheral length or the outer diameter of the functional unit 40 increases as it goes toward the spin-orbit-torque wiring 50. Further, the side surface 40s of the functional unit 40 is inclined with respect to the xy plane when viewed from the x direction or the y direction. An inclination angle θ of the side surface 40s with respect to the xy plane may be different or constant in accordance with the height position in the z direction. The inclination angle θ of the side surface 40s with respect to the xy plane decreases, for example, as it goes toward the spin-orbit-torque wiring 50.

The side surface 40s of the functional unit 40 includes the side surfaces 30s, 20s, 13s, 12s, and 11s of the third ferromagnetic layer 30, the non-magnetic layer 20, the second ferromagnetic layer 13, the oxide containing layer 12, and the first ferromagnetic layer 11. The side surfaces 11s, 12s, 13s, 20s, and 30s are respectively inclined with respect to the xy plane. The side surfaces 11s, 12s, 13s, 20s, and 30s are respectively continuous so as to form one side surface 40s. Here, "continuous" means that the inclination of a tangent drawn along the side surface 40s is constant or changes continuously in a cut plane cut in the xz plane or the yz plane.

Further, the height position of the first surface 50a of the spin-orbit-torque wiring 50 in the z direction is different depending on a location. The first surface 50a is a surface near the functional unit 40 in the spin-orbit-torque wiring 50. Hereinafter, a portion overlapping the functional unit 40 in the z direction in the first surface 50a is referred to as a first surface 50aA and a non-overlapping portion is referred to as a first surface 50aB. The first surface 50aA is located at a position in the +z direction in relation to the first surface 50aB. That is, the first surface 50aA is located at a position separated from a substrate Sub to be described later in relation to the first surface 50aB. The first surface 50aB may be formed at a position in the −z direction from the first surface 50aA by ion milling or the like when the functional unit 40 is processed into a predetermined shape.

Further, as shown in FIG. 5, the side surface 50s of the spin-orbit-torque wiring 50 is inclined with respect to the xy plane. The side surface 50s and the side surface 40s are, for example, discontinuous. "Discontinuous" means that the inclination of the tangent drawn along the side surfaces 50s and 40s does not change continuously in the cut plane cut in the xz plane or the yz plane. When processing the functional unit 40 into a predetermined shape after processing the spin-orbit-torque wiring 50 into a predetermined shape, the side surface 50s and the side surface 40s may be discontinuous.

Further, FIGS. 4 and 5 simultaneously show insulating layers 90 and 91 surrounding the peripheries of the functional unit 40 and the spin-orbit-torque wiring 50. The insulating layers 90 and 91 are insulating layers that insulate between multilayer wirings and between elements. The insulating layers 90 and 91 are made of, for example, silicon oxide (SiOx), silicon nitride (SiNx), silicon carbide (SiC), chromium nitride, silicon carbonitride (SiCN), silicon oxynitride (SiON), aluminum oxide ($Al_2O_3$), zirconium oxide (ZrOx), or the like.

In the spin-orbit-torque type magnetoresistance effect element 201 with the above-described configuration, since the damping constant of the first ferromagnetic layer 11 increases, the force of the magnetization $M_{11}$ to move in the easy magnetization direction increases and hence the magnetization reversal can be performed quickly. Further, since the side surface 11s of the first ferromagnetic layer 11 is inclined with respect to the xy plane, the flow of the current from the spin-orbit-torque wiring 50 to the first ferromagnetic layer 11 is smooth. That is, the spin-orbit-torque type magnetoresistance effect element 201 can prevent a current loss due to a rapid change in current density.

Figure 6:
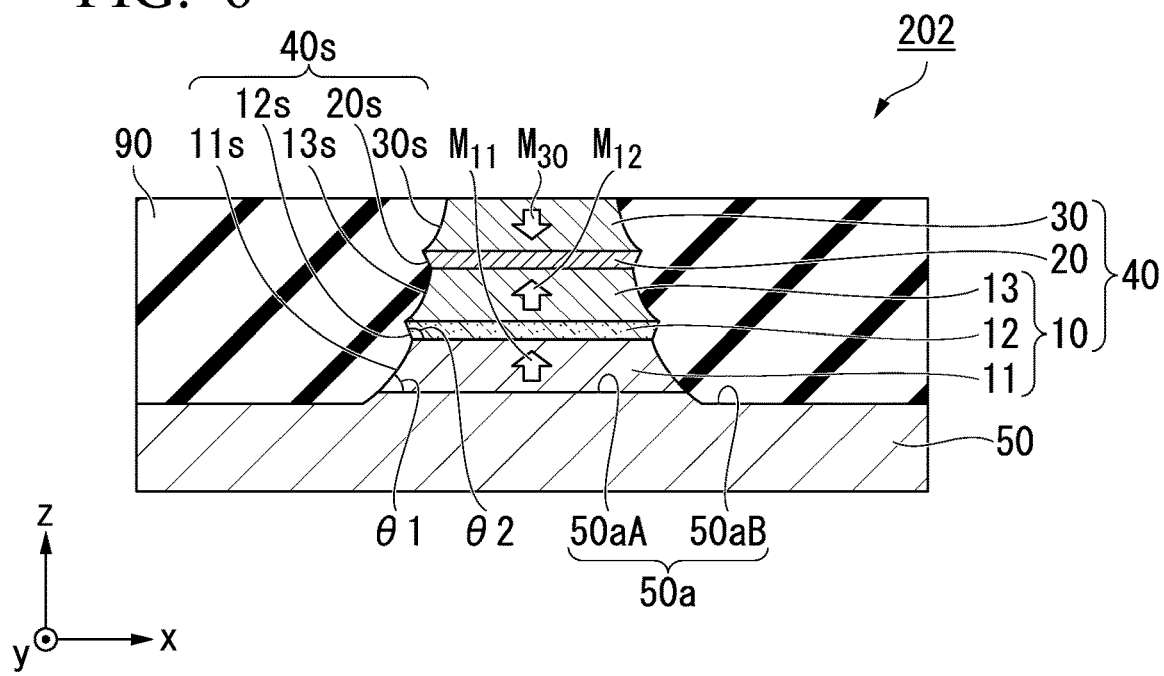
FIG. 6 is a schematic cross-sectional view of a spin-orbit-torque type magnetoresistance effect element according to Modified Example 2.

FIG. 6 is a schematic cross-sectional view of a spin-orbit-torque type magnetoresistance effect element 202 according to Modified Example 2. FIG. 6 shows a cross-section in which the spin-orbit-torque type magnetoresistance effect element 202 is cut along the xz plane passing through the center of the spin-orbit-torque wiring 50 in the y direction. The spin-orbit-torque type magnetoresistance effect element 202 shown in FIG. 6 is the same as the spin-orbit-torque type magnetoresistance effect element 202 according to Modified Example 1 except that the shape of the side surface of the functional unit 40 is different. For this reason, the same reference numerals will be given to the same components as those of the spin-orbit-torque type magnetoresistance effect element 202 and a description thereof will be omitted.

The functional unit 40 shown in FIG. 6 gradually spreads within the xy plane as it goes toward the spin-orbit-torque wiring 50 when viewed from the z direction. The outer peripheral length or the outer diameter of each of the third ferromagnetic layer 30, the second ferromagnetic layer 13, and the first ferromagnetic layer 11 which are made of metal in the functional unit 40 shown in FIG. 6 increases as it goes toward the spin-orbit-torque wiring 50. The outer peripheral length or the outer diameter of each of the non-magnetic layer 20 and the oxide containing layer 12 which are made of a material other than metal in the functional unit 40 shown in FIG. 6 decreases as it goes toward the spin-orbit-torque wiring 50.

The side surfaces 30s, 13s, and 11s of the third ferromagnetic layer 30, the second ferromagnetic layer 13, and the second ferromagnetic layer 11 are inclined by, for example, an inclination angle θ1 with respect to the xy plane. The side surfaces 20s and 12s of the non-magnetic layer 20 and the oxide containing layer 12 are inclined by, for example, an inclination angle θ2 with respect to the xy plane. The inclination angles θ1 and θ2 may be different or constant in accordance with the height position in the z direction. The inclination angle θ1 and the inclination angle θ2 are different from each other. The inclination angle θ1 is, for example, less than 90° and the inclination angle θ2 is, for example, 90° or more.

The side surface 40s of the functional unit 40 is discontinuous. The side surface 40s at the boundary of the side surfaces 11s, 12s, 13s, 20s, and 30s of the layers is discontinuous. The side surface 40s has, for example, a step at the boundary between the third ferromagnetic layer 30 and the non-magnetic layer 20, the boundary between the non-magnetic layer 20 and the second ferromagnetic layer 13, the boundary between the second ferromagnetic layer 13 and the oxide containing layer 12, and the boundary between the oxide containing layer 12 and the first ferromagnetic layer 11.

When forming the functional unit 40, ion milling (side milling) or the like may be performed from the x direction or the y direction after processing from the z direction through a mask. When the side milling is performed, the width of the functional unit 40 in the x direction and the y direction can be decreased and hence the size of the functional unit 40 can be made fine. The degree of side milling depends on the material of the layer. Metals are often softer than non-metals and side milling may progress more with metals than with non-metals. Due to a difference in the degree of progress of the side milling of each layer, the side surface 40s of the functional unit 40 becomes discontinuous.

A spin-orbit-torque type magnetoresistance effect element 203 with the above-described configuration can quickly perform the magnetization reversal since the damping constant of the first ferromagnetic layer 11 increases. Further, since the side surface 11s of the ferromagnetic layer 11 is inclined with respect to the xy plane, the flow of the current from the spin-orbit-torque wiring 50 to the ferromagnetic conductor layer 11 is smooth. Furthermore, when the side surface 40s is discontinuous, the adhesion to the insulating layer 90 can be improved.

Figure 7:
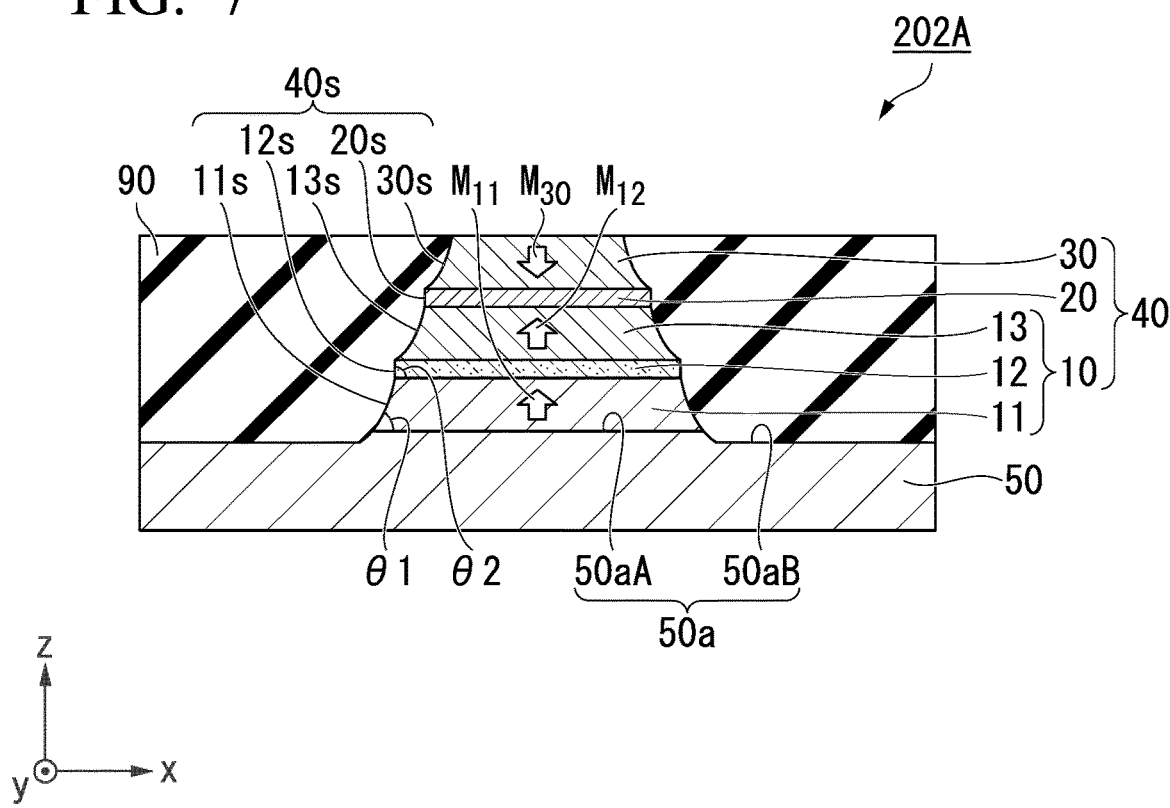
FIG. 7 is a schematic cross-sectional view of another example of the spin-orbit-torque type magnetoresistance effect element according to Modified Example 2.

Further, FIG. 7 is a schematic cross-sectional view of an example of a spin-orbit-torque type magnetoresistance effect element according to Modified Example 2. FIG. 7 shows a cross-section in which the spin-orbit-torque type magnetoresistance effect element 202 is cut along the xz plane passing through the center of the spin-orbit-torque wiring 50 in the y direction. A spin-orbit-torque type magnetoresistance effect element 202A is an example when an inclination angle θ2 is 90°.

Figure 8:
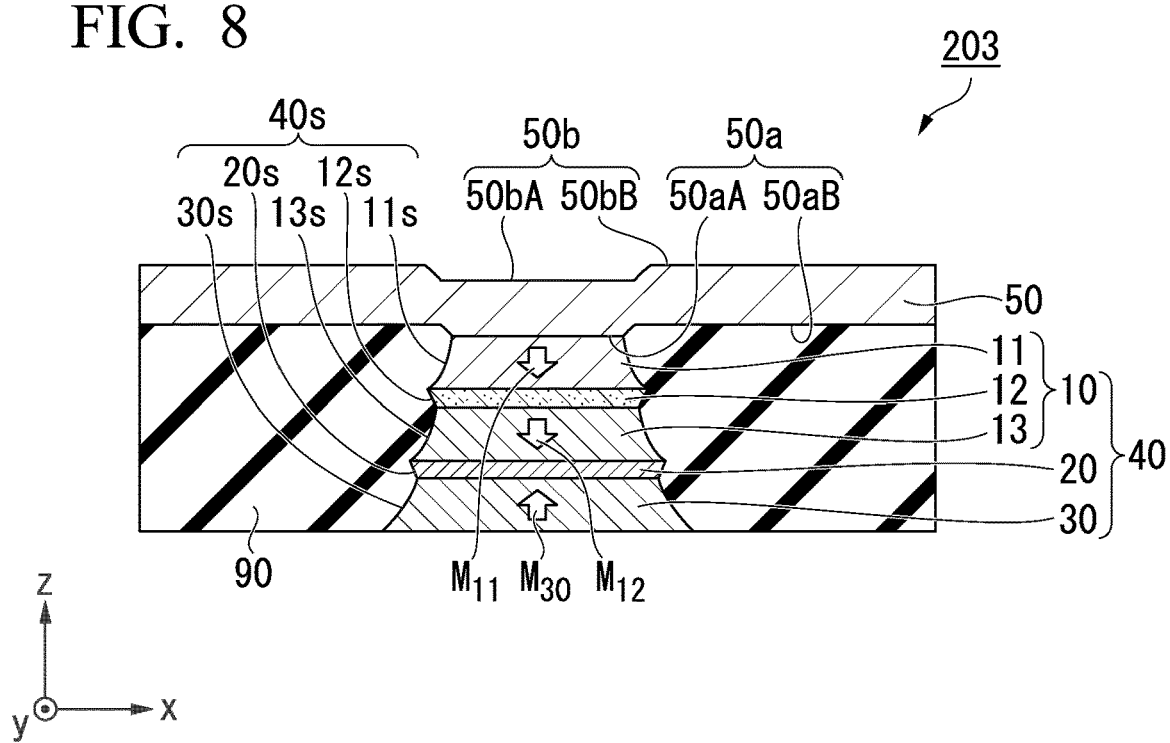
FIG. 8 is a schematic cross-sectional view of a spin-orbit-torque type magnetoresistance effect element according to Modified Example 3.

FIG. 8 is a schematic cross-sectional view of the spin-orbit-torque type magnetoresistance effect element 203 according to Modified Example 3. FIG. 8 shows a cross-section in which the spin-orbit-torque type magnetoresistance effect element 203 is cut along the xz plane passing through the center of the spin-orbit-torque wiring 50 in the y direction. The spin-orbit-torque type magnetoresistance effect element 203 shown in FIG. 8 is the same as the spin-orbit-torque type magnetoresistance effect element 202 shown in FIG. 6 except that the positional relationship between the functional unit 40 and the spin-orbit-torque wiring 50 is different. For this reason, the same reference numerals will be given to the same components as those of the spin-orbit-torque type magnetoresistance effect element 202 and a description thereof will be omitted.

In the spin-orbit-torque type magnetoresistance effect element 203, the spin-orbit-torque wiring 50 is located at a position in the +z direction with respect to the functional unit 40. That is, the spin-orbit-torque wiring 50 is located at a position separated from the substrate Sub to be described in relation to the functional unit 40.

The functional unit 40 includes the third ferromagnetic layer 30, the non-magnetic layer 20, the second ferromagnetic layer 13, the oxide containing layer 12, and the first ferromagnetic layer 11 in this order in the +z direction. The third ferromagnetic layer 30 is located at a position near the substrate Sub to be described later in relation to the first ferromagnetic layer 11. The functional unit 40 may be called a bottom pin structure.

The spin-orbit-torque wiring 50 is laminated at the position of the functional unit 40 and the insulating layer 90 in the +z direction. The height positions of the first surface 50a and the second surface 50b of the spin-orbit-torque wiring 50 in the z direction are different depending on a location. The first surface 50a is a surface near the functional unit 40 in the spin-orbit-torque wiring 50 and the second surface 50b is a surface on the side opposite to the first surface 50a. Hereinafter, a portion overlapping the functional unit 40 in the z direction in the first surface 50a is referred to as a first surface 50aA and a non-overlapping operation is referred to as a first surface 50aB. Hereinafter, a portion overlapping the functional unit 40 in the z direction in the second surface 50b is referred to as a second surface 50bA and a non-overlapping portion is referred to as a second surface 50bB. The first surface 50aB is located at a position in the +z direction in relation to the first surface 50aA. The first surface 50aA is recessed in the −z direction with respect to the first surface 50aB due to a difference in polishing speed when the first surface 50a is subjected to, for example, chemical mechanical polishing (CMP). The second surface 50aB is located at a position in the +z direction in relation to the second surface 50aA. The second surface 50b reflects the shape of the first surface 50a.

The spin-orbit-torque type magnetoresistance effect element 203 with the above-described configuration can quickly perform the magnetization reversal since the damping constant of the first ferromagnetic layer 11 increases even in the bottom pin structure.

The characteristic configurations of Modified Examples 1 to 3 can be also applied to the spin-orbit-torque magnetization rotational element according to the first embodiment.

<Third Embodiment (Magnetic Memory)>

Figure 9:
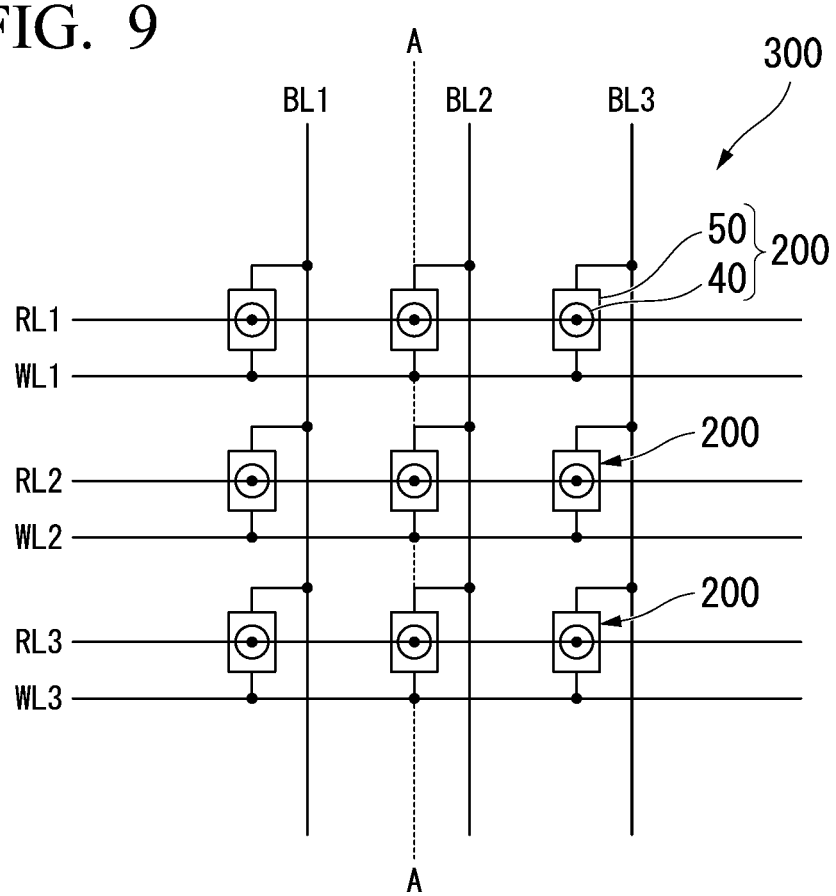
FIG. 9 is a schematic view of a magnetic memory according to a third embodiment.

FIG. 9 is a schematic view of a magnetic memory 300. The magnetic memory 300 includes a plurality of the spin-orbit-torque type magnetoresistance effect elements 200 (see FIG. 3) of the first embodiment. FIG. 3 corresponds to a cross-sectional view in which the spin-orbit-torque type magnetoresistance effect element 200 is cut along a plane A-A of FIG. 9. In the magnetic memory 300 shown in FIG. 9, the spin-orbit-torque type magnetoresistance effect elements 200 are arranged in a 3×3 matrix. FIG. 9 is an example of a magnetic memory and the configuration, number, and arrangement of the spin-orbit-torque type magnetoresistance effect element 200 are optional.

One of word lines WL1 to WL3, one of bit lines BL1 to BL3, and one of read lines RL1 to RL3 are respectively connected to the spin-orbit-torque type magnetoresistance effect element 200.

When a voltage difference of a predetermined value or more is applied across the word lines WL1 to WL3 and the bit lines BL1 to BL3, a current flows to the spin-orbit-torque wiring 50 of an arbitrary spin-orbit-torque type magnetoresistance effect element 200 so that a writing operation is performed. Further, when a voltage difference of a predetermined value or more is applied across the read lines RL1 to RL3 and the bit lines BL1 to BL3, a current flows in the lamination direction of the functional unit 40 of an arbitrary spin-orbit-torque type magnetoresistance effect element 200 so that a reading operation is performed. When data of an arbitrary element is read out from the plurality of spin-orbit-torque type magnetoresistance effect elements 200, the element can be used as a magnetic memory.

Figure 10:
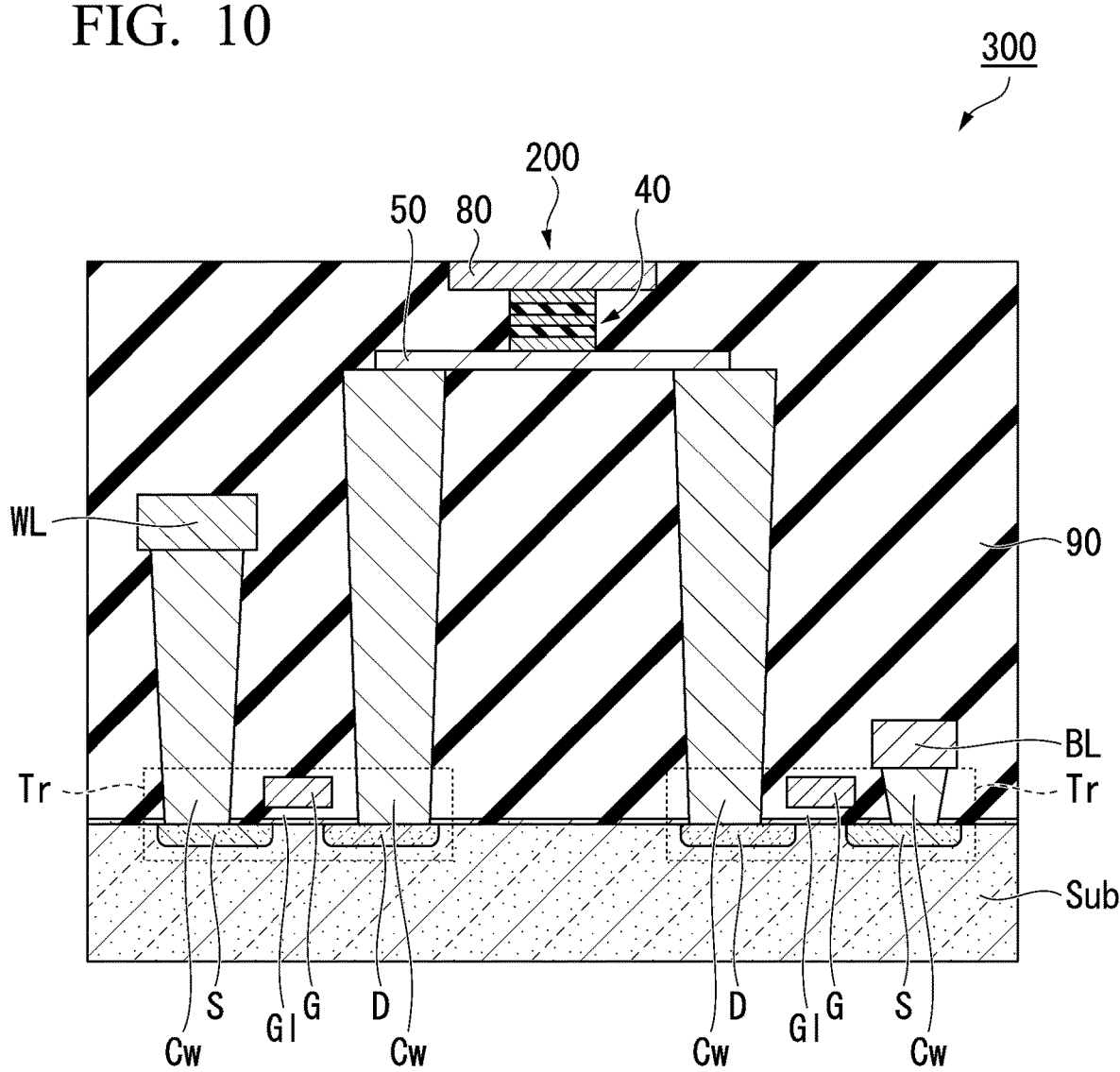
FIG. 10 is a schematic cross-sectional view of a main part of the magnetic memory according to the third embodiment.

Further, FIG. 10 is a cross-sectional view showing a main part of the magnetic memory 300 shown in FIG. 9 when taken along a plane A-A. The magnetic memory 300 includes the spin-orbit-torque type magnetoresistance effect element 200 and a plurality of switching elements connected to the spin-orbit-torque type magnetoresistance effect element 200.

The switching element shown in FIG. 10 is a transistor Tr. The transistor Tr includes a gate electrode G, a gate insulating film GI, and a source region S and a drain region D formed on the substrate Sub. The substrate Sub is, for example, a semiconductor substrate.

Each transistor Tr is electrically connected to the spin-orbit-torque type magnetoresistance effect element 200, the word line WL, and the bit line BL via a conductive portion Cw. The conductive portion Cw may be referred to as, for example, a connection wiring or a via wiring. The conductive portion Cw contains a conductive material. The conductive portion Cw extends in the z direction.

Further, the functional unit 40 of the spin-orbit-torque type magnetoresistance effect element 200 is provided with an electrode 80. The electrode 80 contains a conductive material. The electrode 80 is connected to the read line RL. A switching element (for example, a transistor) may be provided between the read line RL and the electrode 80. The switching element between the read line RL and the electrode 80 is located, for example, in the depth direction (−y direction) in FIG. 10.

The storage element 100 and the transistor Tr are electrically separated by the insulating layer 90 except for the conductive portion Cw.

The magnetic memory 300 according to the third embodiment includes a plurality of the spin-orbit-torque type magnetoresistance effect elements 200 according to the second embodiment. As described above, each spin-orbit-torque type magnetoresistance effect element 200 can quickly perform magnetization reversal. Thus, the magnetic memory 300 can be driven quickly.

REFERENCE SIGNS LIST

10 Laminated body
11 First ferromagnetic layer
12 Oxide containing layer
13 Second ferromagnetic layer
20 Nonmagnetic layer
30 Third ferromagnetic layer
40 Functional unit
50 Spin-orbit-torque wiring
101, 102 Spin-orbit-torque magnetization rotational element
200 Spin-orbit-torque type magnetoresistance effect element
300 Magnetic memory

What is claimed is:

1. A spin-orbit-torque magnetization rotational element comprising:
a spin-orbit-torque wiring; and
a laminated body laminated on the spin-orbit-torque wiring,
wherein the laminated body includes a first ferromagnetic layer, an oxide containing layer, and a second ferromagnetic layer in order from the spin-orbit-torque wiring,
wherein the oxide containing layer contains an oxide of a non-magnetic element, and
wherein the first ferromagnetic layer and the second ferromagnetic layer are ferromagnetically coupled to each other, and
wherein the oxide contained in the oxide containing layer contains insufficient oxygen with respect to a stoichiometric composition.

2. The spin-orbit-torque magnetization rotational element according to claim 1, wherein an easy axis of magnetization of the first ferromagnetic layer intersects a direction of a spin injected from the spin-orbit-torque wiring into the first ferromagnetic layer.

3. The spin-orbit-torque magnetization rotational element according to claim 1, wherein the non-magnetic element of the oxide contained in the oxide containing layer contains at least one selected from a group consisting of Al, Si, Mg, Ti, Cr, Cu, Mo, Ru, Rh, Pd, Hf, Ta, W, Re, Ir, Pt, and Bi.

4. The spin-orbit-torque magnetization rotational element according to claim 1, wherein a film thickness of the oxide containing layer is 1.0 nm or less.

5. A spin-orbit-torque magnetization rotational element comprising:
a spin-orbit-torque wiring; and
a laminated body laminated on the spin-orbit-torque wiring,
wherein the laminated body includes a first ferromagnetic layer, an oxide containing layer, and a second ferromagnetic layer in order from the spin-orbit-torque wiring,
wherein the oxide containing layer contains an oxide of a non-magnetic element, and
wherein the first ferromagnetic layer and the second ferromagnetic layer are ferromagnetically coupled to each other, and
wherein a diffusion preventing layer is inserted between the oxide containing layer and the second ferromagnetic layer.

6. The spin-orbit-torque magnetization rotational element according to claim 5, wherein an easy axis of magnetization of the first ferromagnetic layer intersects a direction of a spin injected from the spin-orbit-torque wiring into the first ferromagnetic layer.

7. The spin-orbit-torque magnetization rotational element according to claim 5, wherein the non-magnetic element of the oxide contained in the oxide containing layer contains at least one selected from a group consisting of Al, Si, Mg, Ti, Cr, Cu, Mo, Ru, Rh, Pd, Hf, Ta, W, Re, Ir, Pt, and Bi.

8. The spin-orbit-torque magnetization rotational element according to claim 5, wherein a film thickness of the oxide containing layer is 1.0 nm or less.

9. The spin-orbit-torque magnetization rotational element according to claim 5, wherein the oxide contained in the oxide containing layer contains insufficient oxygen with respect to a stoichiometric composition.

10. The spin-orbit-torque magnetization rotational element according to claim 1, wherein a diffusion preventing layer is inserted between the oxide containing layer and the second ferromagnetic layer.

11. The spin-orbit-torque magnetization rotational element according to claim 1, wherein a film thickness of the first ferromagnetic layer is thicker than a film thickness of the second ferromagnetic layer.

12. The spin-orbit-torque magnetization rotational element according to claim 5, wherein a film thickness of the first ferromagnetic layer is thicker than a film thickness of the second ferromagnetic layer.

13. The spin-orbit-torque magnetization rotational element according to claim 1, wherein the second ferromagnetic layer contains at least one element selected from a group consisting of Co, Fe, and B.

14. The spin-orbit-torque magnetization rotational element according to claim 5, wherein the second ferromagnetic layer contains at least one element selected from a group consisting of Co, Fe, and B.

15. A spin-orbit-torque type magnetoresistance effect element comprising:
- a spin-orbit-torque magnetization rotational element including, a spin-orbit-torque wiring, and a laminated body laminated on the spin-orbit-torque wiring, the laminated body including a first ferromagnetic layer, an oxide containing layer, and a second ferromagnetic layer in order from the spin-orbit-torque wiring, the oxide containing layer containing an oxide of a non-magnetic element, and the first ferromagnetic layer and the second ferromagnetic layer being ferromagnetically coupled to each other;
- a non-magnetic layer which is laminated on the side opposite to the spin-orbit-torque wiring in the laminated body; and
- a third ferromagnetic layer, the laminated body and the non-magnetic layer being sandwiched between the third ferromagnetic layer and the spin-orbit-torque wiring.

16. A magnetic memory comprising:
a plurality of the spin-orbit-torque type magnetoresistance effect elements according to claim 15.

* * * * *